(12) United States Patent
Karlsen et al.

(10) Patent No.: US 6,952,510 B1
(45) Date of Patent: Oct. 4, 2005

(54) OPTICALLY CORRECTED INTRACAVITY FIBER COUPLED MULTIGAIN ELEMENT LASER

(75) Inventors: Scott R. Karlsen, Lynnwood, WA (US); Mark R. Pratt, Seattle, WA (US); Jason N. Farmer, Seattle, WA (US)

(73) Assignee: nLight Photonics Corporation, Seattle, WA (US)

( * ) Notice: Subject to any disclaimer, the term of this patent is extended or adjusted under 35 U.S.C. 154(b) by 316 days.

(21) Appl. No.: 10/153,363

(22) Filed: May 22, 2002

Related U.S. Application Data

(60) Provisional application No. 60/316,806, filed on Aug. 31, 2001.

(51) Int. Cl.[7] .............................. G02B 6/34; G02B 6/32
(52) U.S. Cl. .......................................... 385/37; 385/31
(58) Field of Search .............................. 385/37, 15, 31, 385/47, 42, 33

(56) References Cited

U.S. PATENT DOCUMENTS

| | | | |
|---|---|---|---|
| 5,511,142 A | * | 4/1996 | Horie et al. .................. 385/129 |
| RE35,332 E | * | 9/1996 | Nagahama et al. ....... 250/201.5 |
| 5,999,672 A | * | 12/1999 | Hunter et al. .................. 385/37 |
| 6,052,394 A | * | 4/2000 | Lee et al. ......................... 372/6 |
| 6,192,062 B1 | | 2/2001 | Sanchez-Rubio et al. |
| 6,208,679 B1 | | 3/2001 | Sanchez-Rubio et al. |
| 6,418,152 B1 | * | 7/2002 | Davis ........................... 372/18 |
| 6,441,934 B1 | * | 8/2002 | Boord et al. .................. 398/87 |
| 6,529,542 B1 | * | 3/2003 | Karlsen et al. ............. 372/108 |
| 6,657,775 B1 | * | 12/2003 | Farmer et al. .............. 359/334 |
| 6,661,948 B2 | * | 12/2003 | Wilde ........................... 385/37 |
| 6,665,471 B1 | * | 12/2003 | Farmer et al. ................ 385/37 |
| 6,834,071 B2 | * | 12/2004 | Sugiyama ..................... 385/43 |

OTHER PUBLICATIONS

U.S. Appl. No. 09/929,837, Farmer et al.
U.S. Appl. No. 09/945,381, Farmer et al.
U.S. Appl. No. 60/316,806, Pratt et al.

* cited by examiner

*Primary Examiner*—Joseph Williams
*Assistant Examiner*—Peter Macchiarolo
(74) *Attorney, Agent, or Firm*—Fulbright & Jaworski LLP

(57) ABSTRACT

An optic device is placed in close proximity to multiple gain elements so as to selectively modify the divergence of the light from said multiple elements such that when the light is subsequently collimated and diffracted from a grating and focused into an optical fiber, it will have a predefined cross-section that matches the mode of the fiber. Using this system and method, a more efficient light transfer is achieved in an intracavity fiber coupled multigain element laser.

5 Claims, 4 Drawing Sheets

$$MAG_i = \frac{\cos \theta_{out}}{\cos \theta_{in}(i)} = \frac{\omega_{out}}{\omega_{in}(i)}$$

OPTICALLY CORRECTED INTRACAVITY FIBER COUPLED MULTIGAIN ELEMENT LASER

CROSS-REFERENCE TO RELATED APPLICATIONS

The present application is related to and claims the benefit of U.S. Provisional Patent Application Ser. No. 60/316,806, entitled "OPTICALLY CORRECTED INTRACAVITY FIBER COUPLED MULTIGAIN ELEMENT LASER," which is incorporated herein by reference, and the present application is related to commonly assigned and co-pending U.S. patent application Ser. No. 09/945,381, entitled "SPECTRALLY TAILORED RAMAN PUMP LASER," filed Aug. 31, 2001, the disclosure of which is hereby incorporated herein by reference.

TECHNICAL FIELD OF THE INVENTION

This invention relates to lasers and more specifically to external cavity diode-lasers having optically corrected multi-wavelength light beams, and even more particularly to selective optically coupled lasers where the shape of the light beams match a desired mode of an optical fiber.

BACKGROUND OF THE INVENTION

Incoherently beam combined (IBC) lasers combine the output from an array of gain elements or emitters (typically consisting of semiconductor material, such as GaAlAs, GaAs, InGaAs, InGaAsP, AlGaInAs, and/or the like, which is capable of lasing at particular wavelengths) into a single output beam that may be coupled into, for example, an optical fiber. The gain elements may be discrete devices or may be included on an integrated device. Due to the geometry of IBC lasers, each gain element lases a particular wavelength. Exemplary arrangements of IBC lasers are described in U.S. Pat. No. 6,052,394 and U.S. Pat. No. 6,192,062.

FIG. 8 depicts a prior art arrangement of components in IBC laser 80. IBC laser includes emitters 82-1 through 82-N associated with fully reflective surface 81 and front surface 84. Emitters 82-1 through 82-N are disposed in a substantially linear configuration that is roughly perpendicular to the optical axis of collimator 85 (e.g., a lens). Collimator 85 causes the plurality of beams produced by emitters 82-1 through 82-N to be substantially collimated and spatially overlapped on a single spot on diffraction grating 86. Additionally, collimator 85 directs feedback from partially reflective component 87 via diffraction grating 86 to emitters 82-1 through 82-N.

Diffraction grating 86 is disposed from collimator 85 at a distance approximately equal to the focal length of collimator 85. Furthermore, diffraction grating 86 is oriented to cause the output beams from emitters 82-1 through 82-N to be diffracted on the first order toward partially reflective component 87. Partially reflective component 87 causes a portion of optical energy to be reflected. The reflected optical energy is redirected by diffraction grating 86 and collimator 85 to the respective emitters 82-1 through 82-N. Diffraction grating 86 angularly separates the reflected optical beams causing a particular wavelength generated by each emitter 82-1 through 82-N to return to each respective emitter 82-1 through 82-N. Accordingly, diffraction grating 86 is operable to demultiplex the reflected beams from reflective component 87.

It shall be appreciated that the geometry of external cavity 83 of IBC laser 80 defines the resonant wavelengths of emitters 82-1 through 82-N. The center wavelength ($\lambda_i$) of the wavelengths fed back to the $i^{th}$ emitter 82-i is given by the following equation: $\lambda_i = A[\sin(\alpha_i) + \sin(\beta)]$. In this equation, A is the spacing between rulings on diffraction grating 86, $\alpha_i$ is the angle of incidence of the light from the $i^{th}$ emitter on diffraction grating 86, and $\beta$ is the output angle on diffraction grating 86 which is common to all emitters 82-1 through 82-N. As examples, similar types of laser configurations are also discussed in U.S. Pat. No. 6,208,679.

BRIEF SUMMARY OF THE INVENTION

The present invention is directed to a system and method which improves the efficiency of fiber coupling IBC lasers by utilizing optics and grating induced anamorphic magnification.

One embodiment of the invention uses a micro optic array placed next to the emitter array for selectively changing the ellipticity of each beam from each individual emitter, such that as each beam is diffracted from the grating, the beam is circular. This circular beam then can be focused into the fiber very efficiently. The system uses an optic that collimates each beam prior to incidence on the grating and an optic that focuses the diffracted beam into the fiber opening. Thus, the intensity profile of the beam being input into the fiber is mode matched to the fiber mode, e.g., round, and the beam can be coupled without substantial losses.

Additionally, each lens of the array can be made different. Accordingly, such a lens array will allow for tailoring the divergence of each individual emitter beam such that after each beam diffracts off the grating, it will be circular.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
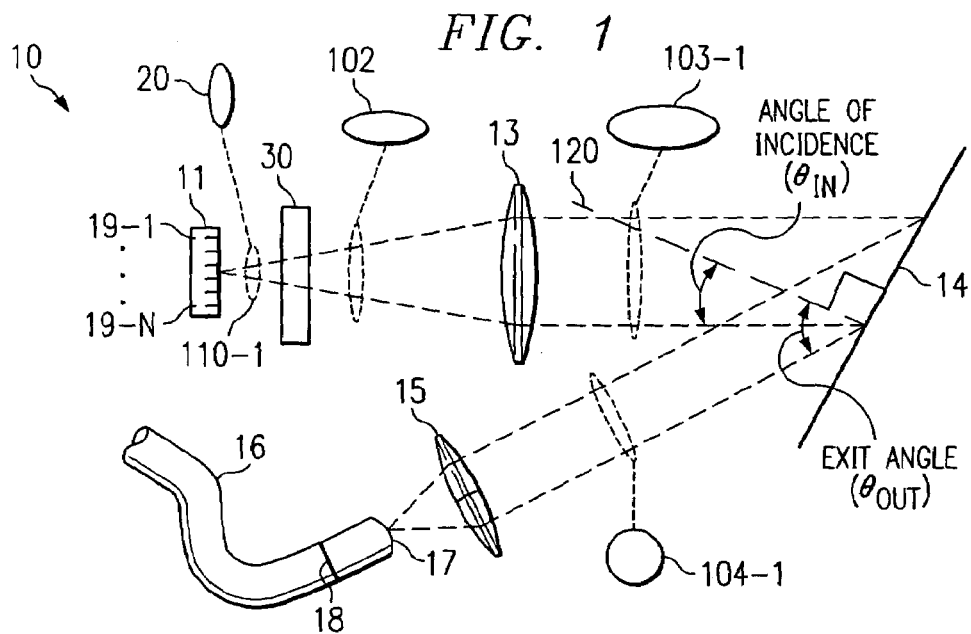
FIG. 1 shows exemplary structural relationships among the elements in accordance with embodiments of the invention.

Turning now to FIG. 1, there is shown system 10 which is a particular embodiment of this invention. In this embodiment, array 11 contains N gain elements, 19-1 to 19-N. For the sake of simplicity, only the beam from a single gain element is shown. Each gain element emits light beam 110-1 (having cross-sectional shape 20) that is preferably shaped by lens component 30 into a beam having elliptical shape 102. Lens component 30 may comprise a single lens element or multiple lens elements. Lens component 30 may comprise a micro lens array, wherein each beam 110-1 is shaped by a respective micro optic of lens component 30 or a rod lens. Beams 102 emerging from lens component 30 are then collimated by optic 13 into cross-sectional shape 103-1. The collimated beams from optic 13 are directed onto diffraction grating 14, which preferably diffracts the beams into a first order, more preferably, the plus first order. Diffraction grating 14 also magnifies or compresses beam shapes 103-1 in the process of diffraction, so that diffracted beams 104-1 are substantially circular in cross-section. Beams 104-1 are typically focused into the core of fiber 16 by optic 15, whose focal length is chosen to match the circular beam into the desired fiber mode.

There is a difference in the beam shape after diffraction from diffraction grating 14 from shape 103-1 to shape 104-1. This magnification or compression occurs principally in one axis. This axis is referred to as the slowly diverging axis, from gain elements 19. Lens component 30 is designed to pre-compensate for the magnification or compression that occurs at diffraction grating 14, as well as for the different divergence patterns in the perpendicular and parallel axis of beam 110-1. It is this pre-compensation that makes beam cross-section 104-1 circular.

Lens component 30 prevents optic 15 from creating a focused beam that has different numerical apertures in the perpendicular and parallel axis thereby preventing diminished coupling efficiency. Thus, by pre-compensating the beam via lens component 30, beam 110-1, as it emerges from lens component 30, takes advantage of the difference in the different axes of divergence as well as the anticipated difference in the magnification or compression experienced at diffraction grating 14 to achieve desired shape 104-1. Axis 120 is normal to diffraction grating 14 and is used to define an angle of incidence ($\theta_{in}$) and an exit angle ($\theta_{out}$). Anamorphic magnification then is $$\frac{\cos\theta_{in}}{\cos\theta_{out}}$$

which equals the ratio of cross-sectional width 104-1 to cross-sectional width 103-1.

Also it should be noted that diffraction grating 14 is preferably positioned where the rays from all gain elements 19-1 to 19-N substantially coincide.

Figure 2A:
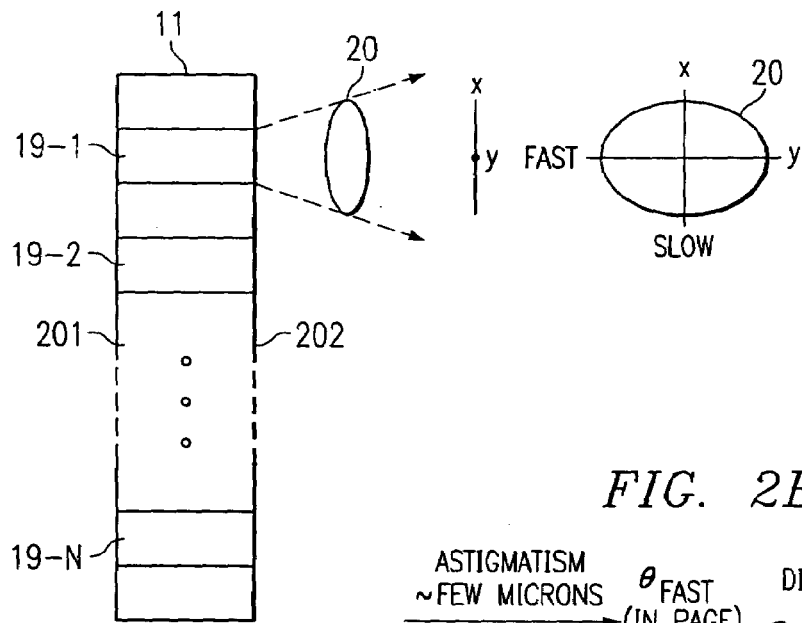
FIGS. 2A and 2B show the light divergence angles from one as light rays from that element.

FIG. 2A substantially represents array 11 having laser gain elements 19-1 to 19-N. Each gain element emits its own cross-sectional emission pattern 20 which is similar for each element. Note that the divergence angle in the Y axis of the pattern 20 is different from the divergence angle in the X axis. The divergence axes are said to be slow and fast. In this view the X-axis referred to as the slow axis because the beam diverges more slowly in this axis. The Y axis is said to be the fast axis because the beam diverges more quickly in this axis. Note that the difference in divergence is from the rectangular shape of the emission plane of the gain element, with the more narrow dimension of the emission plane having the fast divergence angle.

Figure 2B:
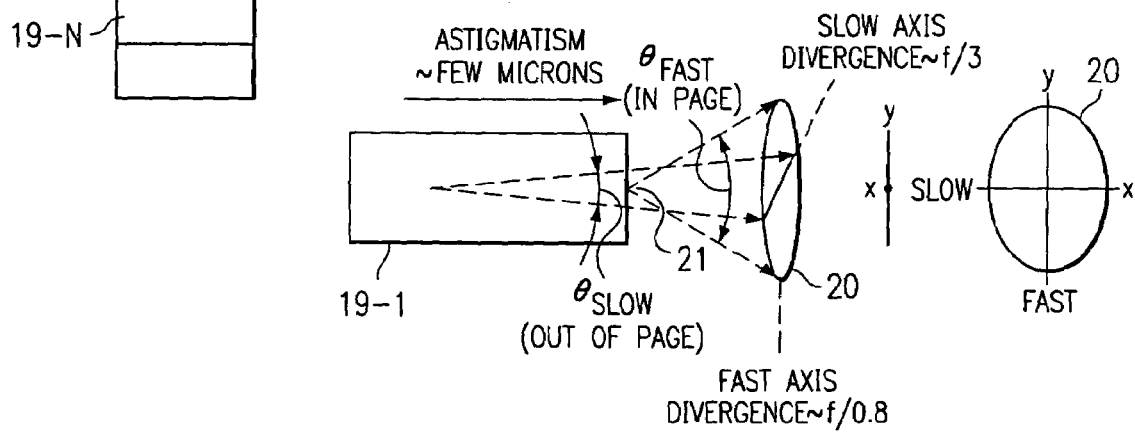

FIG. 2B shows laser gain element 19-1, which has been rotated with respect to the view of FIG. 2A. The fast axis now is vertical on the page, such that gain element 19-1 is now in the plane of the page, and the slow axis (indicated by dashed lines in perspective) is now the beam that is perpendicular on the page. The beam is diverging from point 21 in the emission plane of gain element 19-1.

Figure 3:
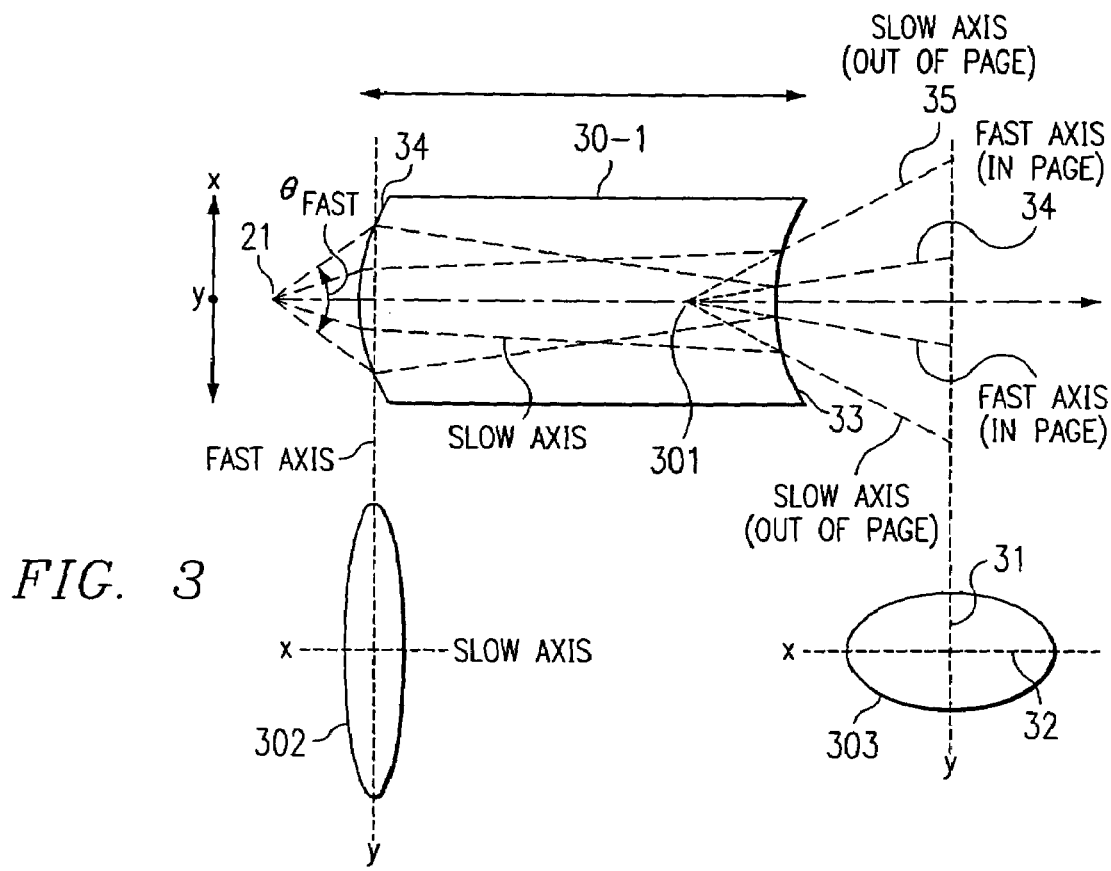
FIG. 3 shows the beam sections for the light within an element micro optic of the invention.

FIG. 3 is a perspective representation that begins at point 21 (of FIG. 2B), which is the point on the emission plane where the beam from gain element 19-1 appears to emerge from the element. As the beam moves to the right, it diverges at different rates in the fast axis and the slow axis. In FIG. 3 the fast axis is again visualized in the plane of the page and the slow axis is perpendicular to the page. The ratio of these divergences is shown in beam cross-section 302, which arrives at input face 34 of lens component 30-1, which preferably has optical power in the fast axis only. Lens component 30-1 in some embodiments is a portion associated with gain element 19-1 in lens component 30 of FIG. 1 which may comprise a lens array. Lens component 30 may also include astigmatism correction surface(s).

Surface 34 is convex and forces the fast axis of the beam to converge toward back surface 33, which is concave such that the beam then starts to diverge from virtual focal point 301. Note that lens component 30-1 is preferably a positive cylindrical lens (in the fast axis), as it reduces the fast axis divergence of a diverging input beam. The basic function of lens component 30-1 is to create beam cross-section 303 (beam cross-section 102, FIG. 1) at its output having a ratio of beam axes 31 and 32 and divergences 34, 35 that (1) it pre-compensates for the magnification or compression that the beam will experience at diffraction grating 14 (FIG. 1), and (2) it corrects for different divergence rates in the fast and slow axes.

The radii of curvature of surface 34 and surface 33 of lens component 30 are chosen to achieve two purposes. The first is to form the beam so that it appears to diverge in both axes (slow and fast) from point 301 and also remove astigmatism; and the second is to form the beam such that the ratio of the major and minor axes of elliptical beam profile 303 are equal to the ratio of the cosines of the input angle $\theta_{in}$ and output angle $\theta_{out}$ on diffraction grating 14, and such that the beam exits diffraction grating 14 having the form desired for maximum coupling efficiency in fiber 16. Note that the preferred form or cross-section is round, as fibers have round cross-sections; however, other shapes, e.g. elliptical, could be used, depending upon the shape of the input pupil function of the coupling device.

A typical thickness for lens component 30-1 of this sort is on the order of 300 microns between surface 34 and surface 33. Typical focal lengths are on the order of 20 to 100 microns.

Figure 4:
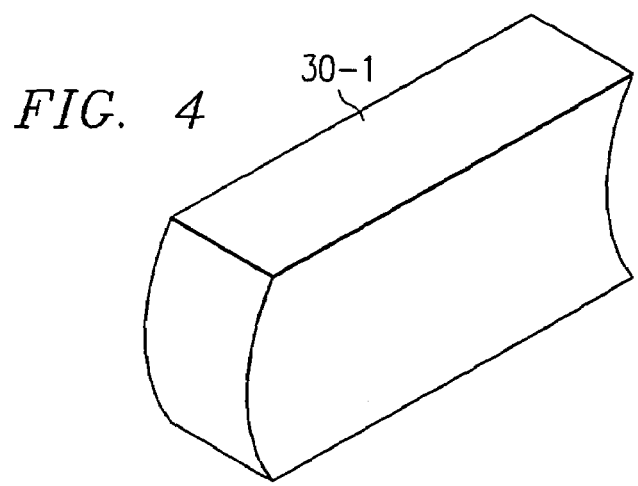
FIG. 4 shows an exemplary shape for the micro optic as used in the invention.

FIG. 4 is a three dimensional view of lens component 30-1. Note that lens component 30-1 can include an aspheric surface (or two) to correct for aberrations, e.g., astigmatism.

Optical elements 30, 13, 14, and 15 are designed such that the beams that are coupled into fiber 16 have the same numerical aperture or transfer mode as that of the fiber. The range of angles accepted by a fiber forms a cone or numerical aperture. Optical elements 30, 13, and 14 are selected so that the output beam from diffraction grating 14 has the desired cross-section. Lens 15 induces a proper converging angle onto the beam. Thus, the combination of optical elements 30, 13, 14, and 15 cause the coupling beams to match the numerical aperture of the fiber, and optionally to match the mode shape for the fiber.

Note that in a preferred embodiment, the arrangement of FIG. 1 forms a laser. The laser cavity may be formed in the system of FIG. 1 by making surface 201 of array 11 (see FIG. 2) highly reflective and including partially reflective element 18 in fiber 16 as shown in FIG. 1. Note that surface 202 may be substantially non-reflective or partially reflective. This embodiment is described in co-pending U.S. patent application Ser. No. 09/929,837 entitled "SYSTEM AND METHOD FOR UTILIZING AN EXTERNAL CAVITY LASER UTILIZING ETALON EMITTERS," filed Aug. 13, 2001, the disclosure of which is hereby incorporated herein by reference in its entirety.

The arrangement operates as follows. Gain elements 19-1, ..., 19-N begin by spontaneous emitting, which is to produce multiple spectral light that is not lasing. Each beam of spontaneous emission light is pre-shaped by lens component 30, and collimated by lens 13. Note that while each beam is individually collimated, the plurality of beams 110-1, ..., 110-N is made to converge superimposed onto diffraction grating 14, e.g. see FIG. 5. Each of the beams is incident on grating 14 at a slightly different angle. The grating diffracts light based upon the wavelength of light as well as the incident angle. Since each beam is a multiple-wavelength beam, diffraction grating 14 diffracts a plurality of output beams, with each different wavelength having a different exit angle. Also, since each of the input beams has a different incident angle, then no two output beams of the same wavelength would have the same exit angle. The partially reflective surface 18, which is located in the core of fiber 16, is arranged at a particular angle with respect to diffraction grating 14. Moreover, the core of the fiber only permits a range of incident angles of light to couple with the fiber. Thus, only light that is within the coupling range of the fiber and that propagates in a substantially co-axial manner from the output angle of diffraction grating 14 through lens 15 will be incident onto partially reflective surface 18 and thus be reflected back to diffraction grating 14. Consequently, the light received and reflected by reflective surface 18 comprises a plurality of different wavelengths, with each wavelength emanating from a unique gain element 19-1, ..., 19-N. The reflected light from reflective surface 18 is directed back through lens 15 to diffraction grating 14, which diffracts the light into a particular output angle, which is dependent upon the wavelength of the light. Thus, the diffracted light is provided to gain elements 19-1, ..., 19-N, with a particular wavelength of light being incident on each particular gain element 19-1, ..., 19-N, via optical elements 13 and 30. Note that the different output angles of the diffracted beam from grating 14 translate into different lateral locations of the beams onto gain elements 19-1, ..., 19-N. The diffracted beams, or feedback beams, cause each gain element 19-1, ..., 19-N to generate stimulated emission at the wavelength of the feedback beam, i.e., "lase." Thus, each gain element 19-1, ..., 19-N tends to lase at a wavelength that is dependent on its respective position in array 11 (i.e., the wavelengths have a unique relationship to position).

Figure 5:
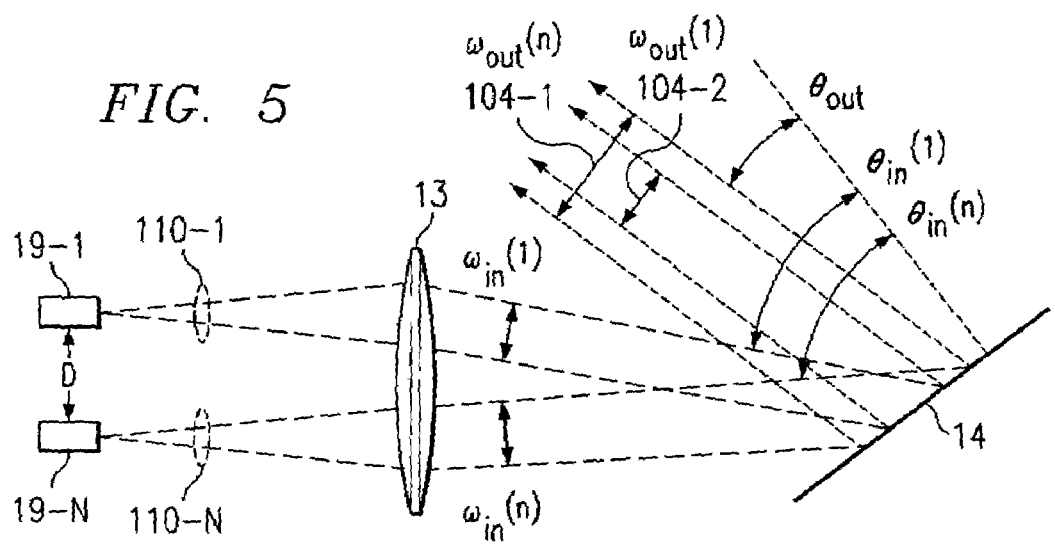
FIG. 5 shows an example of a system being affected by differential magnification.

FIG. 5 illustrates a problem that is encountered in the prior art with an incoherent beam combined (IBC) laser using a large number of gain elements (19-1 to 19-2 shown). The two laser gain elements 19-1 and 19-2 are shown separated by distance 'D' large enough for illustration purposes to create different beam sizes (104-1 and 104-2) on diffraction grating 14. In this case, only one axis, the slow axis, is shown with divergence corresponding to 110-1 and 110-2. Beams 110-1 and 110-2 are both collimated by optic 13, resulting in beam sizes at the output of optic 13 that are the same size. However, because these beams are incident on diffraction grating 14 at different respective angles $\theta_{in}^{(1)}$ and $\theta_{in}^{(2)}$, they illuminate different surface areas of the diffraction gratings 14, thereby, in turn, leading to different respective output beam sizes 104-1 and 104-2. Because these beam sizes are different, they enter the fiber with different numerical apertures, which leads to a reduction in the overall efficiency of the device.

Figure 6:
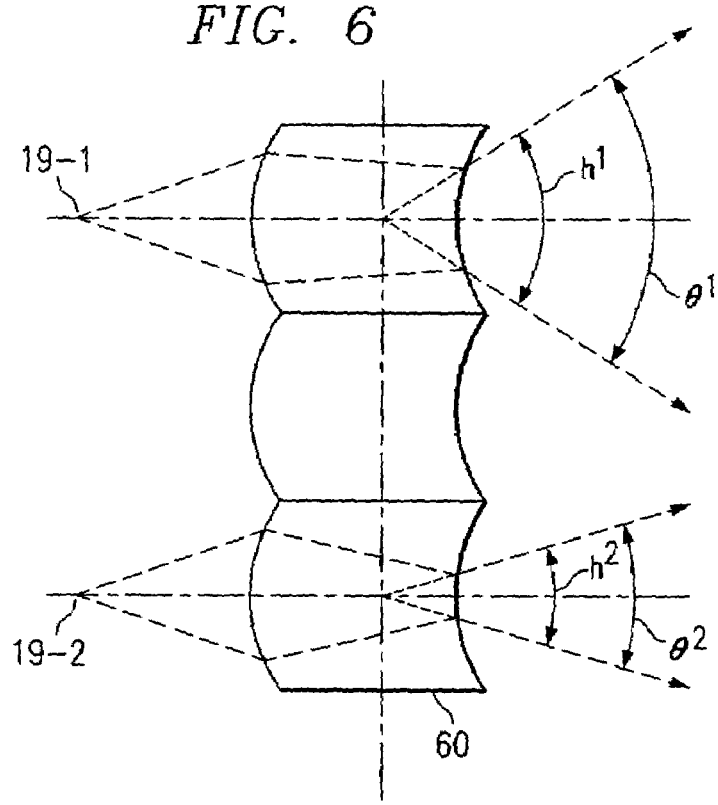
FIG. 6 shows one alternative micro optic design to correct for emitter spacing.

This problem can also be compensated for by micro optic array 60 shown in FIG. 6, which is preferably a graded anamorphic lens array. The slow axis divergence of each beam is processed by a respective micro optic element that is tailored for that beam. Micro optic array 60 is no longer cylindrically symmetric as is lens component 30 (FIG. 1), but rather has different curvature in both the fast axis and the slow axis. The divergence angles of each of these beams are modified such that the beam sizes are pre-compensated, so that when they are incident upon diffraction grating 14, they emerge with the same size and shape.

Lens component 30, as discussed with reference to FIG. 1, comprises one element operating only in one axis, whereas the elements of micro optic array 60 operate in two axes. Lens component 30, or a similar one dimensional micro optic can be used, primarily when the fast and slow axis divergences are significantly different from one another. If those two divergences are similar to one another, as, for example, happens with a buried heterostructure gain element, then a two dimensional micro optic would prove advantageous. Accordingly, pre-compensation with a one dimensional micro optic of a nearly circular beam emitted from emitter 19-1 is not suitable, since the high slow axis divergence typical of a buried heterostructure and the wide emitter array would require a complicated collimated optic 13.

Figure 7:
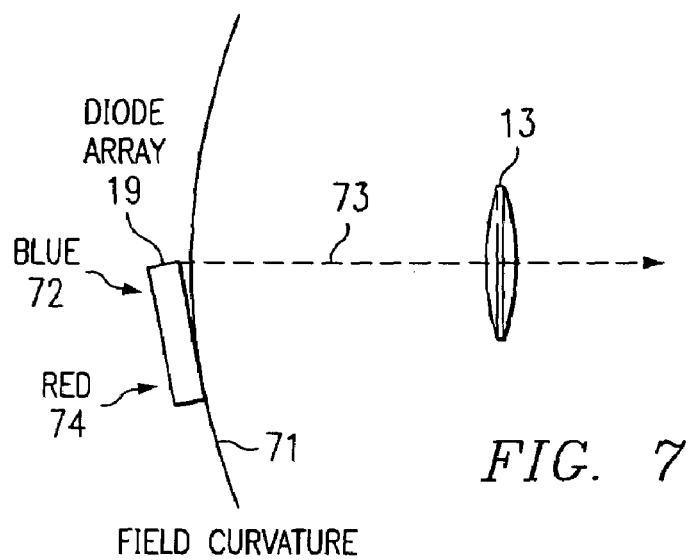
FIG. 7 shows the chromatic aberration correction for an array.
Figure 8:
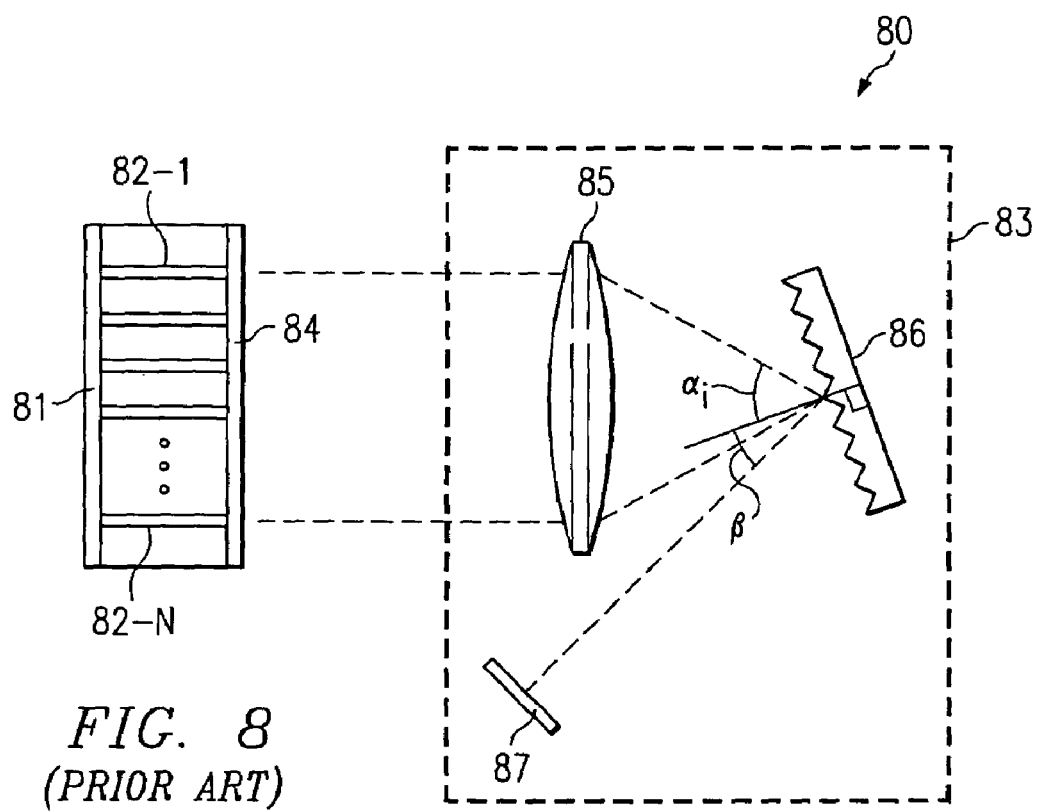
FIG. 8 depicts a prior art arrangement of components in an IBC laser.

FIG. 7 depicts another embodiment of the present invention. The various optics induce aberrations into the beams. The aberrations typically appear as field curvature 71 and chromatic aberration. Thus, light from lens 13 does not focus onto the plane of gain elements in diode array 19, but rather at field curvature line 71. Thus, for elements that are away from central axis 73, the aberration increases as the distance from the central axis. The aberration causes a loss in power efficiency of the laser. Another aberration is chromatic dispersion, wherein optical elements have different indices of refraction for light of different wavelengths. Thus, light of different wavelengths travels slower or faster through optical elements depending upon their wavelengths. Specifically, redder light (longer wavelengths) tends to focus farther than bluer light (shorter wavelengths). The system of FIG. 1 can be arranged so that these two aberrations (field curvature and chromatic aberration) compensate for each other. The system can be configured such that element array 11 (in FIG. 1) is placed on one side of optical axis 73, and with bluer emitting elements 72 (shorter wavelengths) located closer to axis 73, and redder emitting elements 74 located further from the axis. Thus the redder elements would have shorter focal distances from the field curvature, but have longer focal lengths from chromatic dispersion, than the bluer elements. Additionally, gain elements 19 can be tilted, so that the central portion of gain element array is tangential with respect to the field curvature, to further compensate these aberrations.

In other embodiments, IBC laser 10 can be utilized as the excitation source for another laser or laser amplifier. IBC laser 10 can provide its output beam to excite a gain medium that is doped with appropriate materials. For example, IBC laser 10 can excite an optical fiber doped with any of the following materials: Ce, Pr, Nd, Er, Tm, Ho, and Yb. In addition, multiple doping materials can be utilized. In particular, it is advantageous to dope a gain medium with both Yb and Er. It shall be appreciated that the use of IBC laser 10 as the excitation source is advantageous for these types of applications. Specifically, IBC laser 10 is capable of providing a relatively high output power to excite the particular gain medium, because IBC laser 10 is operable to combine the output beams from a plurality of gain elements. As discussed in U.S. patent application Ser. No. 09/945,381 entitled "SPECTRALLY TAILORED RAMAN PUMP LASER," the disclosure of which has been incorporated herein by reference, this invention will also operate for Raman gain, e.g., gain in undoped fibers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of improving the efficiency of fiber coupled laser, said method comprising the steps of:
   creating light from a plurality of light sources, said light moving away from said light source with different divergence patterns in different axes;
   directing said light from said plurality of light sources to impact a diffraction grating, such that light diffracted from said diffraction grating can be focused efficiently into an optical fiber aperture having a certain shape; and
   prior to said light impacting on said grating, optically changing said divergence of light in at least one divergence axis so that said light diffracted from said grating arrives at a focusing point having a cross-section optimized for said fiber aperture shape, wherein a fast axis and slow axis of said light are reversed after said optically changing, and wherein said diffraction grating anamorphically modifies said light such that said light possesses substantially equal divergence in each axes when said light enters said optical fiber aperture.

2. The method of claim 1 wherein said fiber aperture shape is circular.

3. The method of claim 1 wherein said divergence changing step includes the step of positioning a micro-optic array in close proximity to said plurality of light sources.

4. The method of claim 1 further comprising the steps of:
   using a lens to focus the reflected light onto said gain element; and
   positioning said gain elements such that a field curvature aberration of said lens offsets a chromatic aberration of said gain elements.

5. The method of claim 4 wherein the step of positioning is operative to place a bluer wavelength side of said gain elements nearer the optical axis of said focus lens than a redder wavelength side of the gain elements.

* * * * *